United States Patent [19]
Lee et al.

[11] Patent Number: 6,074,519
[45] Date of Patent: Jun. 13, 2000

[54] PLASMA ETCHING APPARATUS HAVING A SEALING MEMBER COUPLING AN UPPER ELECTRODE TO AN ETCHING CHAMBER

[75] Inventors: Se-Hyeong Lee; Jong-Heui Song, both of Kyunggi-do; Min-Woong Choi, Seoul, all of Rep. of Korea

[73] Assignee: Samsung Electronics Co., Ltd., Rep. of Korea

[21] Appl. No.: 09/389,432

[22] Filed: Sep. 3, 1999

[30] Foreign Application Priority Data

Sep. 5, 1998 [KR] Rep. of Korea ............... 98-36647

[51] Int. Cl.[7] .................... H05H 1/00; C23C 16/00
[52] U.S. Cl. .......................... 156/345; 118/723 E
[58] Field of Search .............. 156/345; 118/715, 118/723 E, 725, 728, 733

[56] References Cited

U.S. PATENT DOCUMENTS

| | | | |
|---|---|---|---|
| 3,757,733 | 9/1973 | Reinberg | 118/725 |
| 5,348,587 | 9/1994 | Eichman et al. | 118/723 E |
| 5,722,668 | 3/1998 | Rice et al. | 118/723 E |

OTHER PUBLICATIONS

Excerpts of *MXP Manual*, 1997.
One Page from *TEL UNITY II 855 DD*.

*Primary Examiner*—Shrive Beck
*Assistant Examiner*—P. Hassanzadeh
*Attorney, Agent, or Firm*—Myers Bigel Sibley & Sajovec

[57] ABSTRACT

A plasma etching apparatus is provided having a sealing member coupling an upper electrode to the plasma etching chamber. A peripheral portion of the inner surface of the upper electrode includes a planar surface across both anodized and non-anodized portions of the surface in the peripheral contact region adjacent to the upper portion of the sidewalls of the chamber assembly. A sealing member is positioned between the planar, peripheral portion of the second electrode and the upper portion of the sidewalls to provide a seal therebetween. The anodized portion of the inner surface of the upper electrode may extend over the area adjacent to the opening in the chamber housing and further extend into the peripheral portion beyond the sealing member to reduce the potential for arcing to occur to the non-anodized section during plasma etching operations. Plasma etching apparatus according to the present invention may provide improved sealing, thereby allowing improved control of vacuum level and concentration of processing gas within the plasma etching chamber during etching operations.

18 Claims, 8 Drawing Sheets

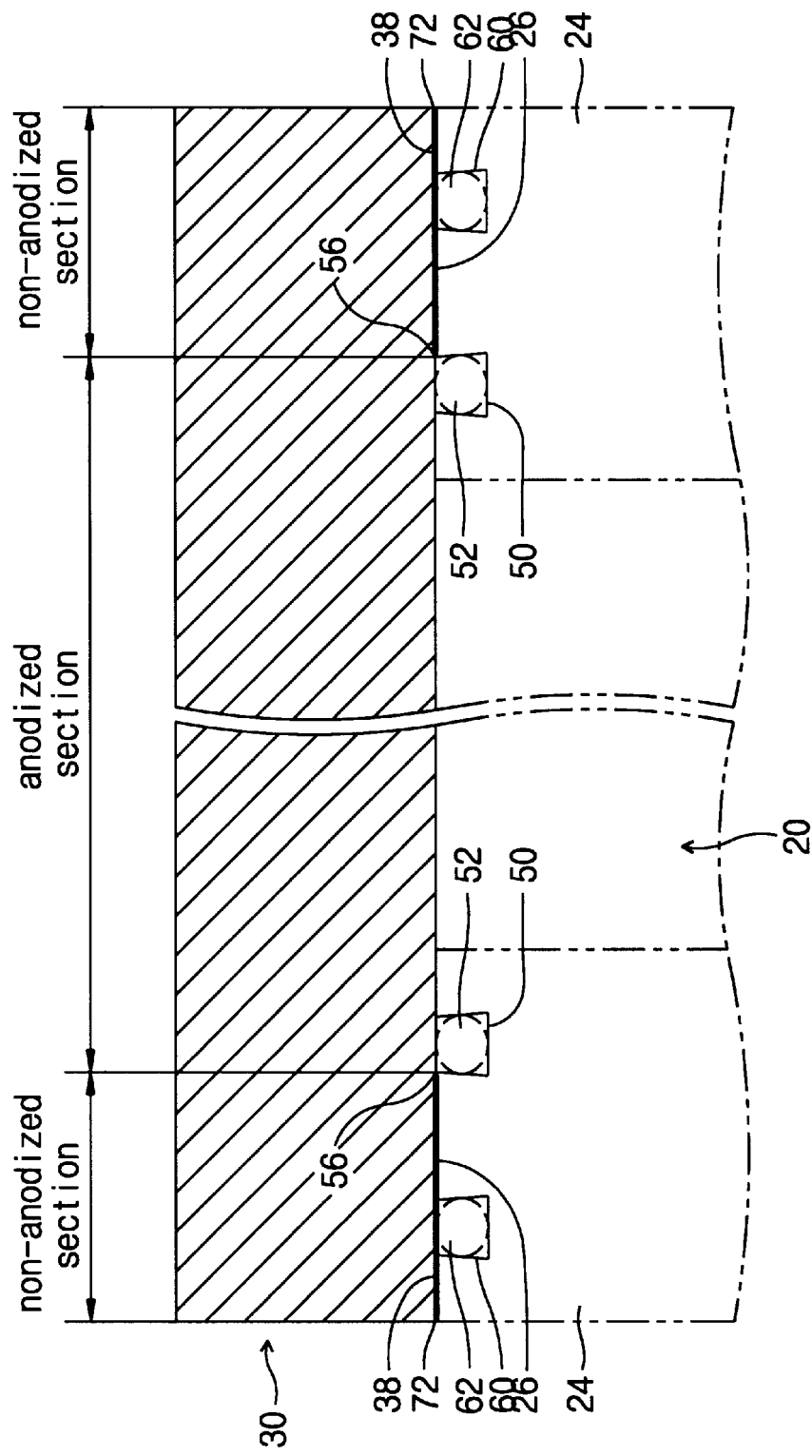

6,074,519

PLASMA ETCHING APPARATUS HAVING A SEALING MEMBER COUPLING AN UPPER ELECTRODE TO AN ETCHING CHAMBER

FIELD OF THE INVENTION

The present invention relates to plasma etching apparatus, and, more particularly, to plasma etching apparatus for etching wafer surfaces in a semiconductor fabricating process.

BACKGROUND OF THE INVENTION

Plasma etching apparatus (sometimes referred to as dry etchers) are typically used to support etching operations as part of a semiconductor device production process. One known type of plasma etching apparatus is a flat plate-type plasma etching apparatus. A flat plate-type plasma etching apparatus typically includes a lower electrode and an upper electrode. The lower electrode is typically positioned within the chamber of the plasma etching apparatus and an object, such as a semiconductor wafer, to be etched is placed on the lower electrode in the plasma etching chamber. The upper electrode is typically placed opposite the lower electrode. In a flat plate-type plasma etching apparatus, the upper electrode generally further acts to provide an upper wall of the plasma etching chamber.

Plasma etching operations may then be carried out on the semiconductor wafer located on the lower electrode in the chamber using the plasma etching apparatus. In order to create an appropriate plasma between the upper electrode and the lower electrode, a high-frequency power signal, such as a radio frequency (RF) signal, is generally applied to the upper or the lower electrode. The applied high-frequency power signal acts on the etching gas injected into the chamber to generate active free radicals or other ionized species to form the plasma. The surface of the semiconductor wafer placed on the lower electrode may then be etched by the plasma.

As semiconductor device technology continues to evolve, critical dimensions for features, such as contacts, continue to be reduced. For example, dimensions for such features may be less then 250 nm. One approach to providing semiconductor device features supporting these critical dimensions includes the use of plasma etching apparatuses which include an upper electrode which itself includes a gas distribution plate through which the gas used in the etching process is injected into the chamber. The gas distribution plate, in turn, is connected to an external gas supply source. Examples of this type of flat plate-type plasma etching apparatus include the Centura5200-MXP device available from the Applied Materials (AMT) and the Unity II 855Dd device of the Tokyo Electron Limited Etch Systems (TEL) department of Samsung Electronics Company.

In plasma etching apparatus such as the MxP and the DRM, the upper electrode is typically a separate member from the components generally defining the plasma etching chamber and is configured to be connected to the remaining chamber wall components so as to close the chamber and position the upper electrode relative to the lower electrode. When the upper electrode is connected to the sidewall portion of the chamber housing member, the plasma etching chamber may be sealed up to allow a vacuum to be generated in the chamber during etching operations. It is, accordingly, desirable to provide a connection between the upper electrode and the remaining walls of the chamber which provides for sealing of the chamber and further provides the ability to electrically connect the upper electrode to the sidewalls of the chamber. In such devices, the upper electrode is typically made with a contact portion which connects with the sidewalls of the chamber and which is made of the same material as the remainder of the upper electrode.

The upper electrode in a flat plate-type plasma etching apparatus is typically made of an aluminum (Al) material. Generally, commercially used Al materials contain some amount of impurity elements which may provide for improved mechanical or chemical characteristics in, the Al material. Likewise, the sidewall and bottom wall portions defining the chamber of the plasma etching apparatus may similarly be made from the same Al material as the upper electrode. As the plasma etching is performed by applying a high-frequency signal to the Al material defining the upper electrode and other walls of the chamber, which Al material may contain such impurities, particles of the impurity atoms or of Al may themselves be etched from the electrode or walls of the chamber and be distributed into the chamber itself. Such released particles or impurity atoms may subsequently be mixed with a feature, such as a thin film, which is being formed on a semiconductor wafer or other object being etched. This, in turn, may result in what is sometimes referred to as heavy metal contamination or other defects in the etched wafer.

In order to reduce the problem caused by impurity atoms or other particles being introduced during the etching process, it is known to anodize the surface of the Al material (i.e., anodic oxidation is applied to a surface of the Al material which is exposed to the chamber). The exposed surface of the Al material is thereby coated with an alumina coating film (typically $Al_2O_3$). The alumina coating film is generally higher than Al in hardness and has improved anti-corrosive properties. Accordingly, during the plasma etching operations, the alumina coating film on the Al material surface may reduce the potential for particles of Al or impurity ions from being introduced into the chamber and subsequently being deposited on the semiconductor material being etched.

The inner surface of a flat plate-type upper electrode typically has an anodized portion with a non-planar or stepped feature on the inner surface of the electrode in the region where the upper electrode is connected to a upper surface of the sidewalls of the chamber when assembled. Such an irregular, stepped feature may be provided because of the thickness introduced by the alumina coating film on the underlying plate electrode as a portion of the inner surface in the contact region between the upper plate electrode and the sidewalls of the chamber is typically left non-anodized to provide a common material contact area between the upper electrode and the sidewalls of the chamber. This surface discontinuity may interfere with the effectiveness of the seal between the upper electrode and the remaining walls of the chamber. Accordingly, the vacuum rate or concentration of processing gas may vary within the chamber. As such, these known systems may have difficulty in maintaining processing conditions for etching the surface of the semiconductor wafer being etched. For example, impurity particles may be allowed to enter into the chamber between the upper electrode and the sidewalls of the chamber. Furthermore, component parts forming the chamber of the plasma etching apparatus may be exposed to environmental contaminants which may, in turn, shorten the operative life cycle of various exposed parts.

A further problem which may occur in these prior approaches to plasma etching apparatus results from the use of a non-anodized region (provided for allowing an improved electrical connection between the upper electrode and the sidewalls of the chamber) which region may be damaged during operation. As imperfect seal may occur between the anodized and non-anodized regions of the upper electrode resulting from the imperfect sealing between the parts forming the plasma etching chamber. For example, when an imperfect seal is provided, arcing into the chamber may be generated at the non-anodized portions when high-frequency power is applied during the plasma etching operation. Surface damage resulting from such arcing originating at the non-anodized region may result in further vacuum leakage and generate additional particle impurity introduction into the chamber.

SUMMARY OF THE INVENTION

It is, therefore, an object of the present invention to provide a plasma etching apparatus having an upper electrode which may be reliably sealed to the sidewalls of the etching chamber during etching operations.

In order to provide for the foregoing objective, a plasma etching apparatus is provided having a sealing member coupling an upper electrode to the plasma etching chamber. A peripheral portion of the inner surface of the upper electrode includes a planar surface across both anodized and non-anodized portions of the surface in the peripheral contact region adjacent to the upper portion of the sidewalls of the chamber assembly. A sealing member is positioned between the planar, peripheral portion of the second electrode and the upper portion of the sidewalls to provide a seal therebetween. In a further aspect of the plasma etching apparatus of the present invention, the anodized portion of the inner surface of the upper electrode may extend over the area adjacent to the opening in the chamber housing and further extend into the peripheral portion beyond the sealing member to reduce the potential for arcing to occur to the non-anodized section during plasma etching operations. Plasma etching apparatus according to the present invention may provide for improved sealing, thereby allowing improved control of vacuum level and concentration of processing gas within the plasma etching chamber during etching operations. Furthermore, by extending the anodized section of the upper electrode beyond the sealing member, the upper electrode region within the plasma etching chamber may avoid damage even if arcing occurs on the non-anodized section during plasma etching operations. This may reduce the risk of arcing related damage adversely affecting the performance of the seal between the upper electrode and the chamber, in turn, reducing the exposure of parts of the chamber to contaminants which could otherwise pass into the chamber during processing under vacuum conditions. The plasma etching apparatus of the present invention may further provide for increased part life by reducing the exposure of chamber surfaces to contaminants.

In one embodiment of the present invention, a plasma etching apparatus is provided including a first member having sidewalls, a bottom and an opening, the sidewalls, bottom and opening defining a chamber. A first electrode is positioned in the chamber. A second electrode is positioned adjacent to the opening of the first member which electrode has an inner surface, the inner surface having a peripheral portion extending beyond the opening and positioned to engage an upper portion of the sidewalls of the first member. The peripheral portion is substantially planar adjacent to the upper portion of the sidewalls. A sealing member is positioned between the peripheral portion of the inner surface of the second electrode and the upper portion of the sidewalls of the first member that provides a seal therebetween.

In a further embodiment, the upper portion of the sidewalls is planar and the peripheral portion of the inner surface adjacent to the upper portion of the sidewalls and the upper portion of the sidewalls are substantially parallel. A second sealing member is positioned encircling the first sealing member, the second sealing member being positioned between the peripheral portion of the inner surface of the second electrode and the upper portion of the sidewalls of the first member. In one embodiment, a first groove is provided in the upper portion of the sidewalls encircling the opening of the first member and a second groove is provided in the upper portion of the sidewalls encircling the first groove. The first sealing member is positioned in the first groove and the second sealing member is positioned in the second groove.

In another embodiment, the first sealing member is a nonconductive O-ring and the second sealing member is a conductive O-ring positioned to electrically couple the sidewalls and the second electrode. The conductive O-ring includes a conductive outer layer.

In a further embodiment, the inner surface of the second electrode includes an anodized portion adjacent to the opening of the first member and extending beyond the first sealing member and a non-anodized portion adjacent to the second sealing member and abutting the anodized portion between the first sealing member and the second sealing member. The first groove may include an outer edge furthest from the opening and the anodized portion may extend at least about 4 millimeters (mm) beyond the outer edge of the first groove. In one embodiment, the anodized portion extends to between about 4 mm and about 5 mm beyond the outer edge of the first groove. The anodized portion and the non-anodized portion of the inner surface in a further embodiment are substantially co-planar adjacent to the upper surface of the sidewalls so that the peripheral portion of the inner surface is substantially planar adjacent to the upper surface of the sidewalls.

In a further embodiment, a plasma etching apparatus is provided including a first member having sidewalls, a bottom and an opening, the sidewalls, bottom and opening defining a chamber. A first electrode is positioned in the chamber. A second electrode is positioned adjacent to the opening of the first member which has an inner surface, the inner surface having a peripheral portion positioned to engage an upper portion of the sidewalls of the first member. A first sealing member is positioned between the peripheral portion of the inner surface of the second electrode and the upper portion of the sidewalls of the first member that provides a seal therebetween. The inner surface of the second electrode includes an anodized portion adjacent to the opening of the first member and extending into the peripheral portion beyond the first sealing member and a non-anodized portion adjacent to the anodized portion.

BRIEF DESCRIPTION OF THE DRAWINGS

FIG. 3B is a schematic cross-sectional view illustrating a method for forming the anodized section of the upper electrode of FIG. 3A.

DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout and signal lines and signals thereon may be referred to by the same reference symbols.

Figure 1A:
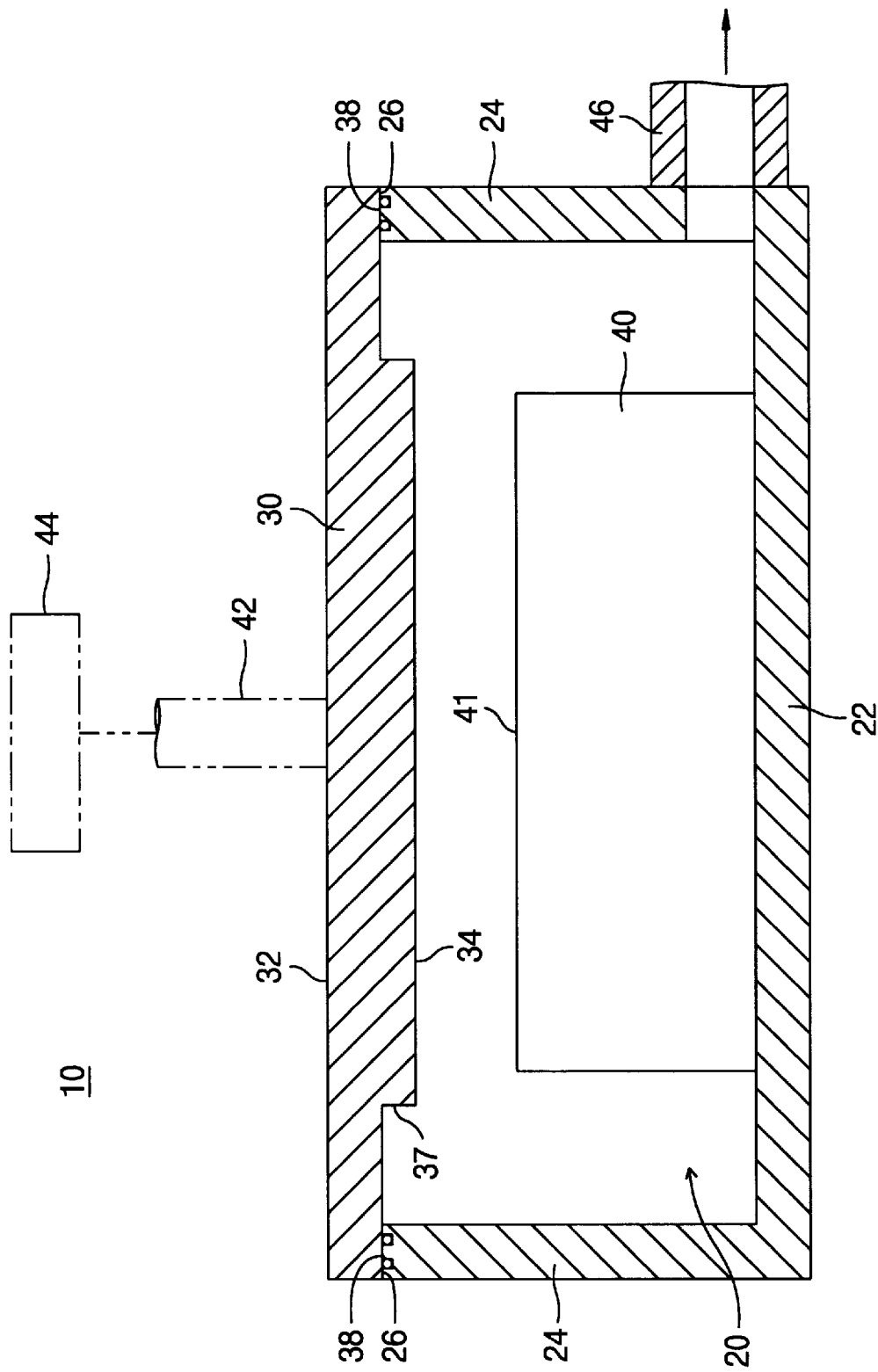
FIG. 1A is a schematic cross-sectional view of a plasma etching apparatus according to an embodiment of the present invention.
Figure 1B:
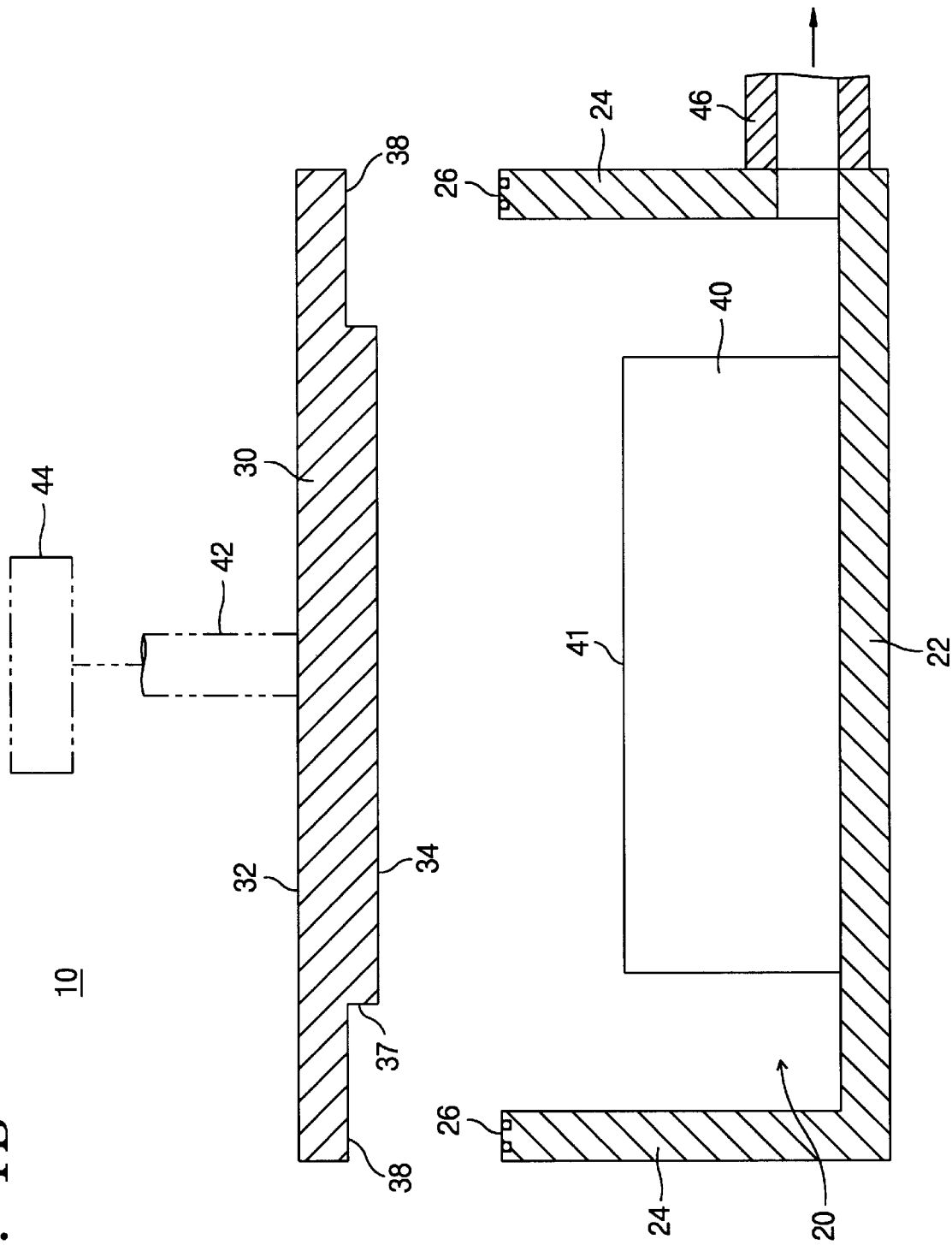
FIG. 1B is a schematic cross-sectional view of the plasma etching apparatus of FIG. 1A with the upper electrode separated from the chamber housing.

Referring now to FIG. 1A and FIG. 1B, a plasma etching apparatus 10 according to an embodiment of the present invention will now be described. The plasma etching apparatus 10 includes a chamber 20, an upper electrode 30, and a lower electrode 40. The chamber 20 is defined by a chamber housing including a bottom 22 and sidewalls 24. An opening 28 of chamber 20 is illustrated in FIG. 1B coplanar with the upper portion 26 of the sidewalls 24.

When the plasma etching apparatus 10 is assembled, as illustrated in FIG. 1A, the upper electrode 30 is placed on the upper portion 26 of the chamber sidewalls 24 covering opening 28 and connected to the chamber housing to, among other things, provide a top to chamber 20 during plasma etching operations. A contact surface 38 is positioned on a peripheral portion of the inner surface 37 of the upper electrode 30. The contact surface 38 is positioned to connect with the upper portion 26 of the sidewalls 24 to further define the chamber 20 during plasma etching operations. The inner surface 37 further includes an internal surface portion 34 which is positioned within the chamber 20 opposite the lower electrode 40 through the opening 28 of the chamber 20 when the upper electrode 30 is connected to the chamber housing.

In the illustrated embodiment of FIG. 1A and FIG. 1B, a gas supply pipe 42 is also provided which is connected to the outer surface 32 of the upper electrode 30. The gas supply pipe 42 is in turn connected to a gas source 44. The gas supply pipe 42 provides for the supply of the gas, such as Fluorine (F) or Chlorine (Cl), which is introduced into the chamber 20 during plasma etching operations to provide the plasma for etching. More particularly, provision of the gas supply pipe 42 in the upper electrode 30 provides for the gas to be introduced into the chamber 20 through the upper electrode 30. Accordingly, in the illustrated embodiment, the upper electrode 30 further operates as a shower head nozzle and may include appropriate known structures for shower head nozzles suitable for use in a plasma etching apparatus.

The upper electrode 30 and the chamber housing including sidewalls 24 and bottom 22 may be made of an Al material which may include various impurity elements introduced to improve the mechanical or chemical properties of these components. As the selection of such Al materials is known to those of skill in the art it will not be discussed further herein. However, as discussed in the background section above, it is also desirable to anodize the Al surfaces exposed to the chamber 20 during plasma etching operations to reduce the likelihood of particles of Al or impurity atoms being introduced into the chamber 20 by etching during plasma etching operations. Accordingly, as illustrated, for example, in FIG. 2A an anodized section (portion) is provided on the inner surface 37 of the upper electrode 30 by, for example, anodic oxidation (anodizing).

It is also desirable to provide a good electrical coupling between the upper electrode 30 and the chamber housing including sidewalls 24. Accordingly, a non-anodized section (portion) is provided on the inner surface 37 as illustrated, for example, in FIG. 2A. More particularly, the non-anodized portion is provided on the contact surface 38 in the peripheral region of the upper electrode 30 which may provide a good electrical connection between the chamber housing and the upper electrode 30.

As shown in FIG. 1A and FIG. 1B, the lower electrode 40 is positioned in chamber 20 opposite the internal surface 34 of the upper electrode 30. When the upper electrode 30 is connected to the chamber housing, the lower electrode 40 is located a selected distance from the internal surface 34 to provide a desired etching performance when the high-frequency signal is applied to the upper electrode 30 and the chamber housing. It is to be understood that the present invention may also be beneficially utilized in plasma etching apparatus in which the high-frequency signal is applied to the lower electrode 40 and the upper electrode 30 provides the ground electrode.

During plasma etching operations, a silicon semiconductor wafer or other type substrate (not shown) to be used to fabricate a semiconductor device through, among other things, surface etching operations, is placed on an upper surface 41 of the lower electrode 40. A high-frequency electrical signal source, such as a radio frequency source, is connected to the lower electrode 40 or, alternatively, to the sidewalls 24 or the upper electrode 30 so as to form a plasma between the upper electrode 30 and the lower electrode 40 from gas introduced into chamber 20 through gas supply pipe 42 connected to a gas source 44. The chamber 20 may be mainained under vacuum conditions during operations. A gas discharge pipe 46 is also provided in the chamber housing. As shown in FIG. 1A and FIG. 1B, one end of the gas discharge pipe 46 is connected to a portion of the chamber 20 and the other end thereof is coupled to a gas discharge system (not shown).

Figure 2A:
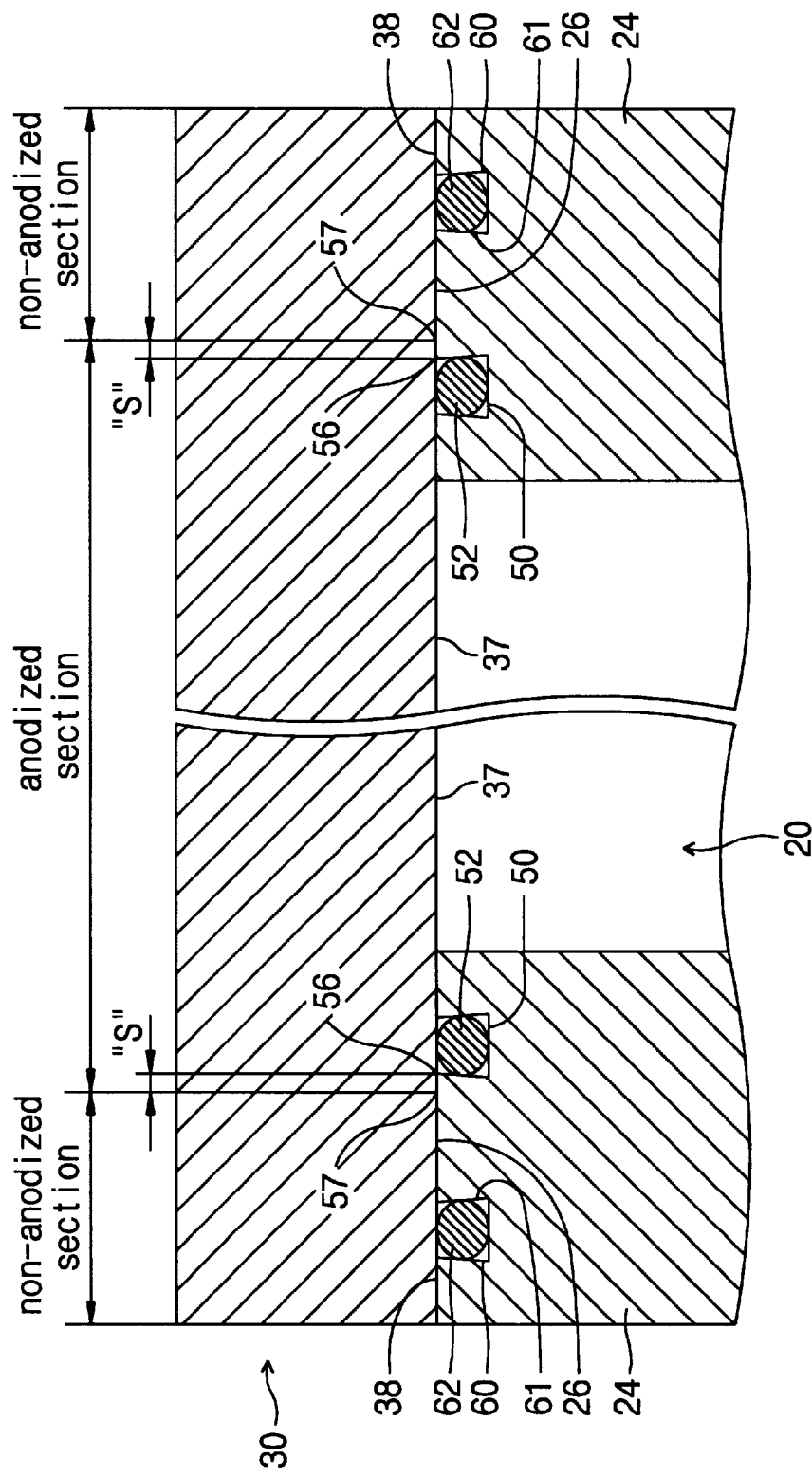
FIG. 2A is a schematic cross-sectional view of the interface between an upper electrode and the sidewalls of the chamber according to an embodiment of the present invention.
Figure 2B:
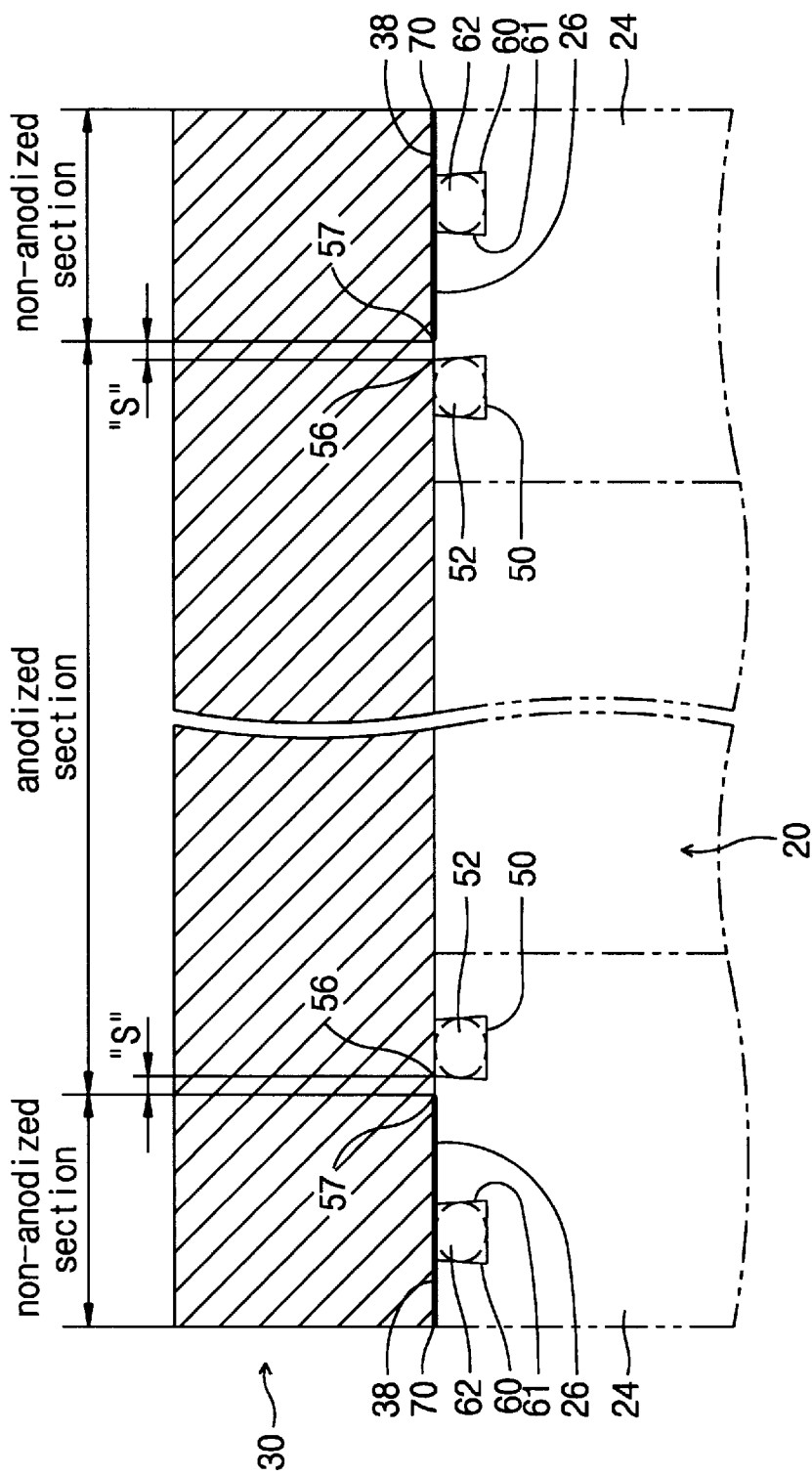
FIG. 2B is a schematic cross-sectional view illustrating a method for forming the anodized portion of the upper electrode in the embodiment of FIG. 2A.

Referring now to FIG. 2A and FIG. 2B, the connection between the upper electrode 30 and the chamber housing for an embodiment of the present invention will be further described. The contact surface 38 of the upper electrode 30 which is to be mated with the chamber sidewalls 24 is a planar (flat) surface adjacent to the upper surface 26 of the sidewalls 24. In the illustrated embodiment of FIG. 2A, two sealing members 52, 62 are positioned between the contact surface 38 of the upper electrode 30 and the upper surface 26 of the sidewalls 24 that provide a seal therebetween. The sealing members in the illustrated embodiment are O-ring 52 and O-ring 62.

The first O-ring 52 is made of a non-conductive material such as a rubber material. In a preferred embodiment, the second O-ring 62 is a conductive sealing member. For example, the second O-ring 62 may be a composite structure with an inner portion made from a rubber material and with a surface layer made from a conductive material. The conductive O-ring 62 provides for electrical coupling between the upper electrode 30 and the sidewalls 24.

As shown in FIG. 2A, the first O-ring 52 is positioned in a first groove 50 in the upper portion 26 of sidewall 24 which encircles the opening 28. The second O-ring 62 is positioned in the upper portion 26 of sidewall 24 in a second groove 60 which encircles the first groove 50. Each groove 50, 60 is positioned in the region where the contact surface 38 is mated with the upper surface 26 of the sidewalls 24. The first groove 50 and the second groove 60 may, alternatively, be formed in the contact surface 38 of the upper electrode 30.

Figure 5:
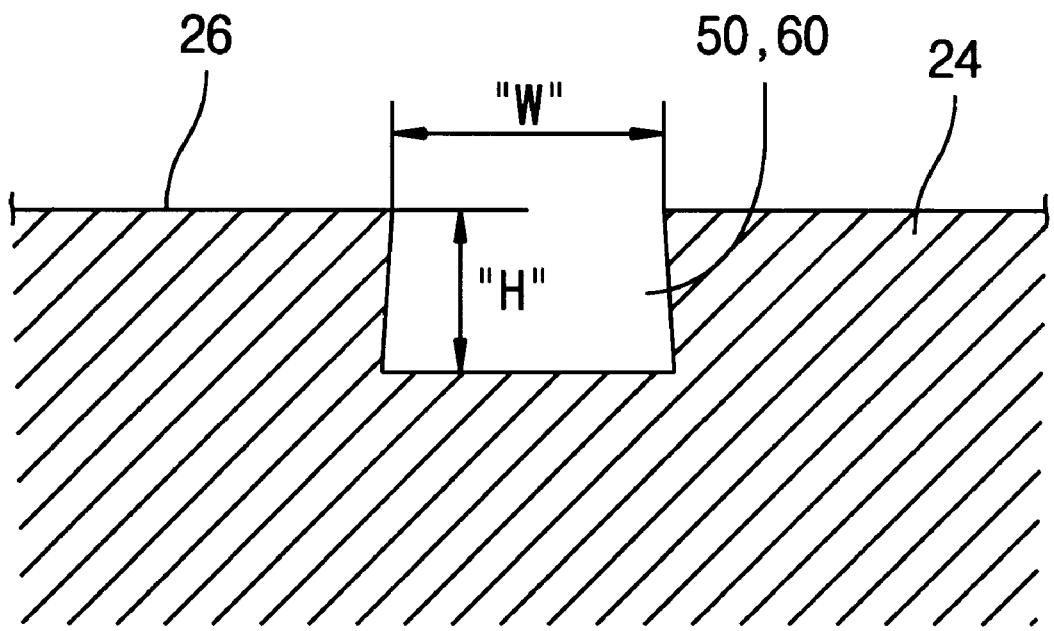
FIG. 5 is a schematic cross-sectional view illustrating a method for forming the grooves in the upper portion of the chamber sidewalls illustrated in various of the preceding embodiments.
Figure 1B:
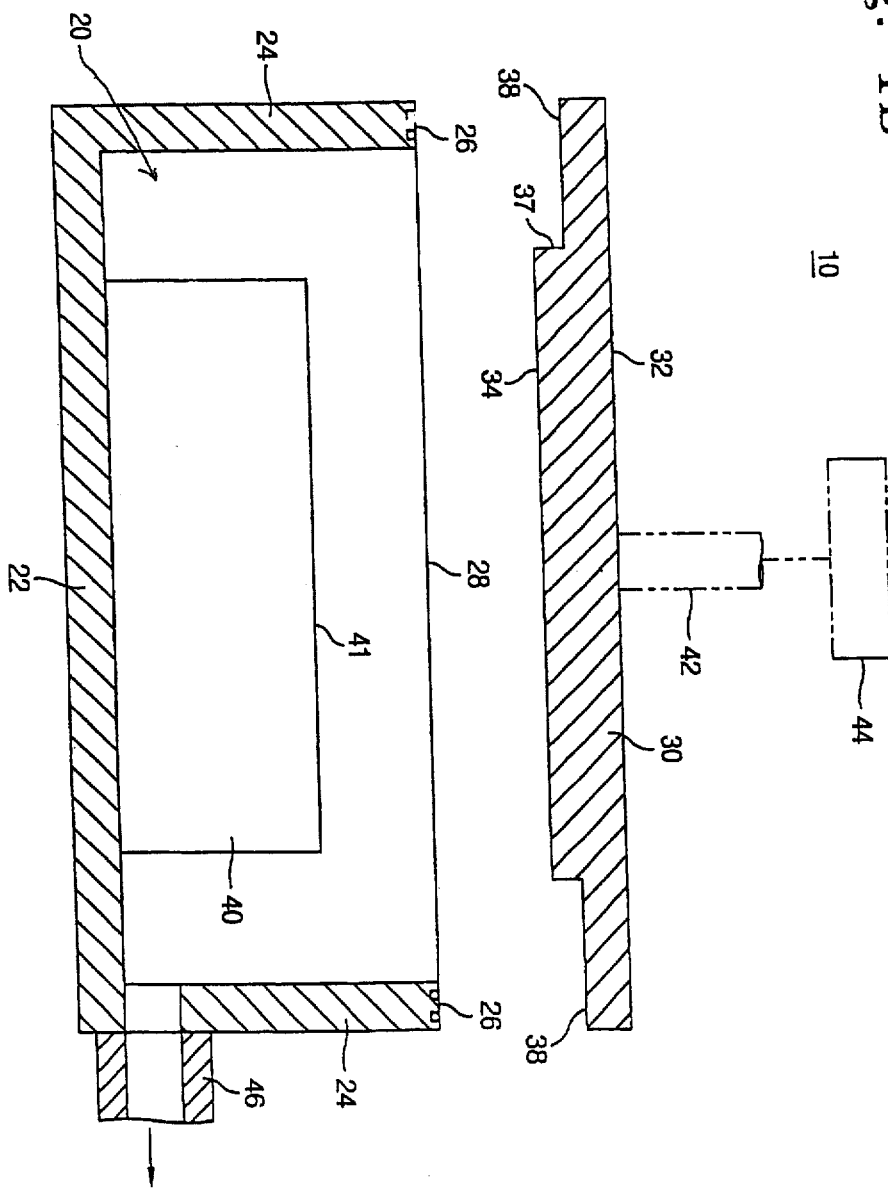

The first groove 50 and the second groove 60 may be formed using standard dimensions for an O-ring groove. For example, as shown in FIG. 5, the height (H) of a groove for an O-ring is generally 0.7 times the diameter of the O-ring and the width (W) is typically 0.95 times the diameter of the O-ring. The diameter of both the first O-ring 52 and the second O-ring 62 is preferably 3.4 mm with a groove height (H) of about 2.69 mm to about 2.8 mm and a groove width (W) of about 3.23 mm. However, it is to be understood that other diameter O-rings may be utilized in practising the present invention. It is further to be understood that other types of sealing members may also be used as known to those of skill in the art including seals with non-circular cross-sections and other types of seals that may be utilized to provide a seal between two substantially planar surfaces. While O-rings are preferred, a Vespel or similar material gasket may also be used in accordance with the present invention.

As discussed above, the upper electrode 30 is electrically connected to the chamber housing. To facilitate the electrical coupling, a non-anodized section is formed on the contact surface 38 of the upper electrode 30 which may provide an improved electrical connection. The surface of the non-anodized section may be made of an Al material with a selected amount of added impurity materials such as Iron (Fe), Chromium (Cr), Nickel (Ni), or Copper (Cu) which may be added to affect the chemical or mechanical properties of the material in a desired manner. Accordingly, when anodizing the inner surface 37 of the upper electrode 30, the non-anodized section is retained on the contact surface 38 of the upper electrode 30 as illustrated, for example, in FIG. 2A. Preferably, the non-anodized section is formed at the peripheral (outside) portion of the upper electrode 30 while including a portion of the contact surface 38.

In a preferred embodiment, as illustrated in FIG. 2A and FIG. 2B, the anodized section ends and the non-anodized section begins between the first groove 50 and the second groove 60. This configuration is preferred as it may reduce the likelihood of an arc being generated at the non-anodized section during plasma etching operations as compared with a configuration in which the non-anodized section extends to the chamber 20 side of the inner seal 52. Such an arc event could in turn damage the upper electrode 30. While the non-anodized section could extend to the outer (farthest from the opening 28) edge 56 of the first groove 50 or even slightly further and still end on the side of the first seal away from the chamber 20, as a practical matter it is difficult to reliably extend the non-anodized section this close to the first seal without having at least some regions extend to the chamber 20 side of the first seal.

A variety of methods may be utilized to form the non-anodized section. As illustrated in FIG. 2B, the non-anodized section of the contact surface 38 may be formed at a uniform distance S from the outside edge 56 of the first groove 52. The distance S is preferably less than the distance between the outer edge 56 of the first groove 50 and the inner edge 61 of the second groove providing a transition between the anodized and non-anodized sections between the grooves 50, 60. The distance S is preferably at least about 4 mm beyond the outer edge 56 and more preferably is between about 4 mm and about 5 mm beyond the outer edge 56. Furthermore, to the extent that the first seal is formed closer to the opening 28 then the outer edge 56, the distances for S as discussed above may alternatively be with respect to the position of the seal formed by the first sealing member 52 (the first seal).

The anodized section may be formed by using a mask 70 as illustrated in FIG. 2B. The mask 70 is intended to prevent anodizing of the non-anodized section when the contact surface 38 is anodized. The mask 70 may, for example be provided using a tape. In one method of forming the upper electrode 30, a cutting process may be utilized, for example, a milling apparatus for creating the inner surface 37. During forming, the contact surface 38 is preferably made substantially planar (flat) and parallel to the upper surface 26 of the sidewalls 24 which upper surfaces 26 are also preferably planar. Before anodizing the inner surface 37 of the upper electrode 30, the mask 70 is preferably coated on the non-anodized section so that the non-anodized section will not be anodized during the anodizing operation.

Figure 3A:
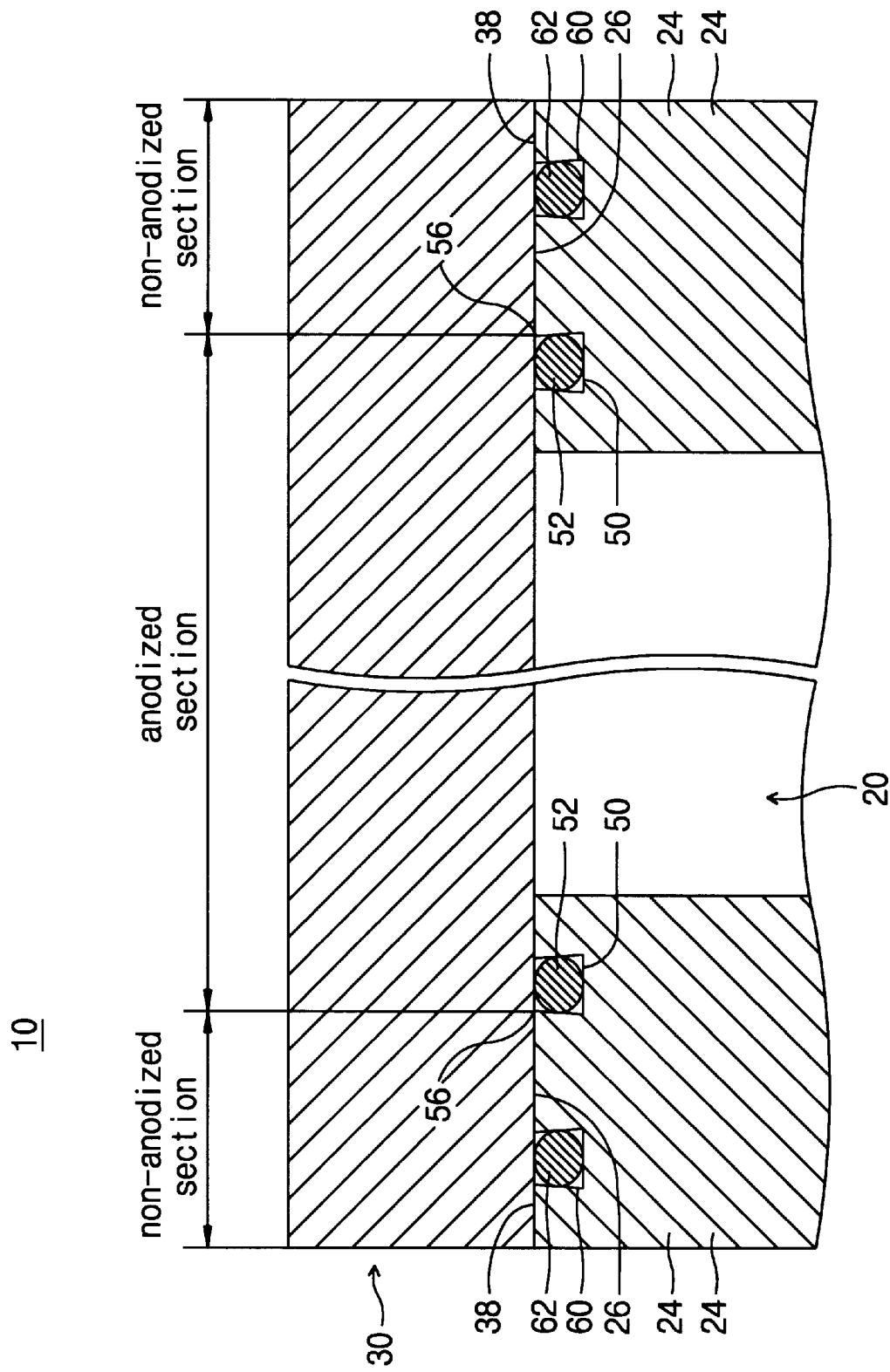
FIG. 3A is a schematic cross-sectional view of the interface between the upper electrode and the sidewalls of the chamber for another embodiment of the present invention.

Referring now to FIG. 3A and FIG. 3B, a further embodiment of the present invention will be described. In the embodiment of FIG. 3A and FIG. 3B, the non-anodized section of the contact surface 38 is again located in the outer peripheral region of the upper electrode 30. However, in this embodiment the transition between the non-anodized and the anodized sections is illustrated as being at the outside edge 56 of the first groove 50. As shown in FIG. 3B, the non-anodized section is provided by using a mask 72.

Figure 4:
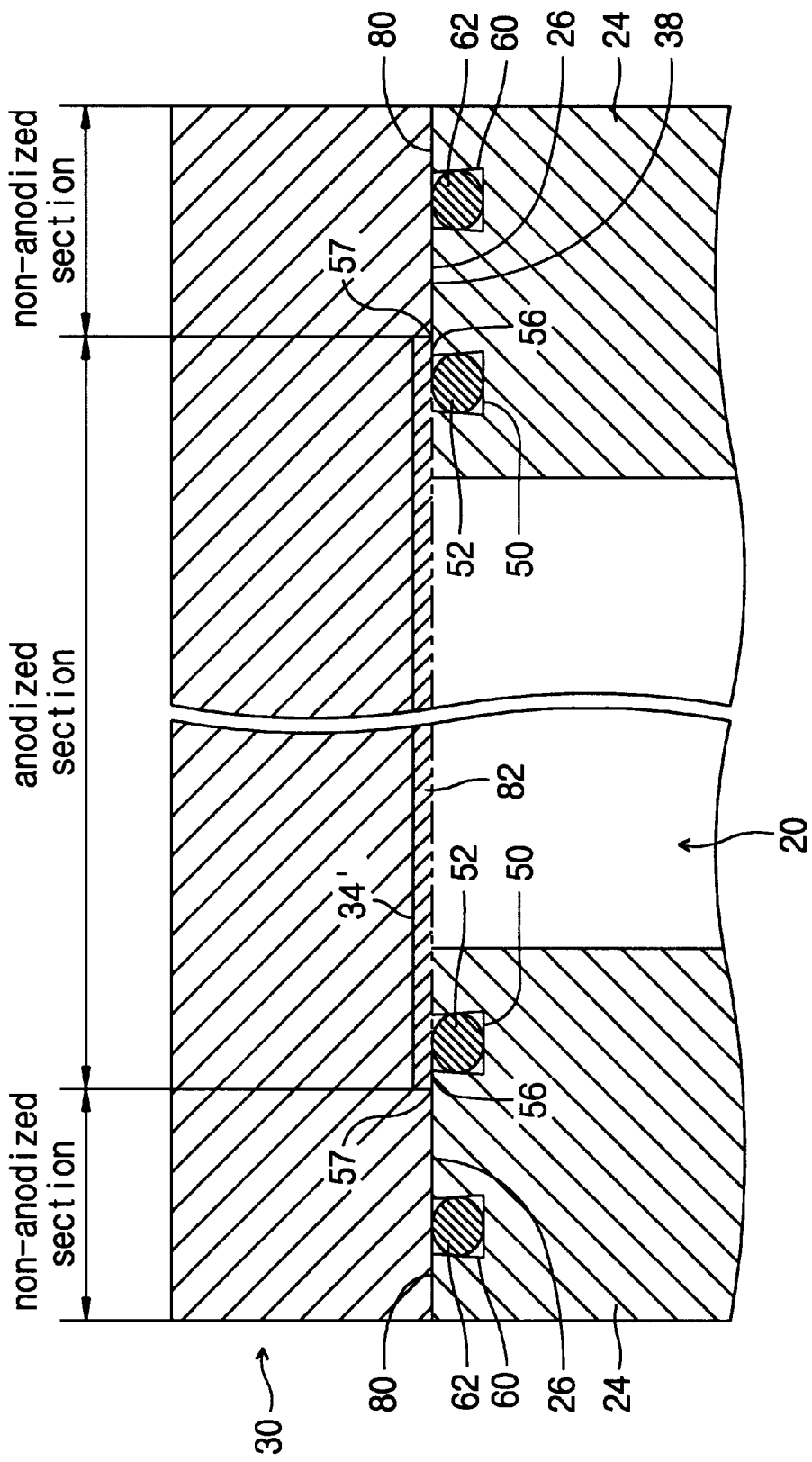
FIG. 4 is a schematic cross-sectional view of the interface between the upper electrode and the sidewalls of the chamber for a further embodiment of the present invention.

Referring now to FIG. 4, a further embodiment of the present invention is shown which provides a substantially co-planar surface in both the anodized and non-anodized sections of the contact surface 38. A substantially planar contact surface 38 is thereby provided even though the anodizing process itself increases the height of the anodized section. The thickness of the anodizing film 82 may, for example, be several micrometers ($\mu$m). Accordingly, in the embodiment of FIG. 4, before anodizing the surface 34' of the upper electrode 30, the portion of the contact surface 80 corresponding to the anodized section is formed with a height offset from the portion corresponding to the non-anodized section substantially equal to the thickness of the anodizing film 82. Anodizing is then performed, resulting in anodized and non-anodized sections which are substantially co-planar (having the same height).

Referring now to FIG. 5, a groove 50, 60 in the upper surface 26 of the sidewalls 24 suitable for use with the present invention is illustrated. FIG. 5 further illustrates the dimensional relationship between the height (H) and the width (W) as those terms were used in the discussion above.

By providing an improved seal between an an upper electrode and a chamber housing in a plasma etching apparatus, the present invention may provide improved control and uniformity of the vacuum level and/or the concentration of processing gas in the chamber 20 while plasma etching is performed. Furthermore, by extending the anodized section beyond the first seal, the risk of damage to the upper electrode can be reduced, because the formation of an arc at the non-anodized section when the plasma etching is performed may be suppressed. Accordingly, an improved processing environment in chamber 20 for plasma etching a semiconductor wafer or other workpiece may be provided. Furthermore, by reducing the likelihood of the introduction of contaminants into the chamber 20, the present invention may extend the life of various component parts of the plasma etching apparatus.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A plasma etching apparatus comprising:

a first member having sidewalls, a bottom and an opening, the sidewalls, bottom and opening defining a chamber;

a first electrode positioned in the chamber;

a second electrode positioned adjacent to the opening of the first member and having an inner surface, the inner surface having a peripheral portion extending beyond the opening and positioned to engage an upper portion of the sidewalls of the first member, the peripheral portion being substantially planar adjacent to the upper portion of the sidewalls;

a first sealing member positioned between the peripheral portion of the inner surface of the second electrode and the upper portion of the sidewalls of the first member that provides a seal therebetween;

a second sealing member positioned between the peripheral portion of the inner surface of the second electrode and the upper portion of the sidewalls of the first member, the second sealing member encircling the first sealing member; and wherein the first sealing member is a nonconductive O-ring and the second sealing member is a conductive O-ring positioned to electrically couple the sidewalls and the second electrode.

2. A plasma etching apparatus according to claim 1 wherein the upper portion of the sidewalls is planar and the peripheral portion of the inner surface adjacent to the upper portion of the sidewalls and the upper portion of the sidewalls are substantially parallel.

3. A plasma etching apparatus to claim 1 further comprising:

a first groove in the upper portion of the sidewalls encircling the opening of the first member of;

a second groove in the upper portion of the sidewalls encircling the first groove; and wherein the first sealing member is positioned in the first grooves and the second sealing member is positioned in the second groove.

4. A plasma etching apparatus according to claim 3 wherein the inner surface of the second electrode includes an anodized portion adjacent to the opening of the first member and extending beyond the first sealing member and a non-anodized portion adjacent to the second sealing member and abutting the anodized portion between the first sealing member and the second sealing member.

5. A plasma etching apparatus according to claim 4 wherein the first groove includes an outer edge furthest from the opening and wherein the anodized portion extends at least about 4 mm beyond the outer edge of the first groove.

6. A plasma etching apparatus according to claim 5 wherein the anodized portion extends to between about 4 mm and about 5 mm beyond the outer edge of the first groove.

7. A plasma etching apparatus according to claim 4 wherein the anodized portion and the non-anodized portion of the inner surface are substantially co-planar adjacent to the upper surface of the sidewalls so that the peripheral portion of the inner surface is substantially planar adjacent to the upper surface of the sidewalls.

8. A plasma etching apparatus according to claim 1 wherein the conductive O-ring includes a conductive outer layer.

9. A plasma etching apparatus comprising:

a first member having sidewalls, a bottom and an opening, the sidewalls, bottom and opening defining a chamber;

a first electrode positioned in the chamber;

a second electrode positioned adjacent to the opening of the first member and having an inner surface, the inner surface having a peripheral portion positioned to engage an upper portion of the sidewalls of the first member; and a first sealing member positioned between the peripheral portion of the inner surface of the second electrode and the upper portion of the sidewalls of the first member that provides a seal therebetween;

wherein the inner surface of the second electrode includes an anodized portion adjacent to the opening of the first member and extending into the peripheral portion beyond the first sealing member and a non-anodized portion adjacent to the anodized portion.

10. A plasma etching apparatus according to claim 9 wherein the anodized portion extends at least about 4 mm beyond the first sealing member.

11. A plasma etching apparatus according to claim 10 wherein the anodized portion extends to between about 4 mm and about 5 mm beyond the first sealing member.

12. A plasma etching apparatus according to claim 9 wherein the anodized portion and the non-anodized portion of the inner surface are substantially co-planar adjacent to the upper surface of the sidewalls so that the peripheral portion of the inner surface is substantially planar adjacent to the upper surface of the sidewalls.

13. A plasma etching apparatus according to claim 9 further comprising a second sealing member positioned encircling the first sealing member, the second sealing member being positioned between the peripheral portion of the inner surface of the second electrode and the upper portion of the sidewalls of the first member.

14. A plasma etching apparatus according to claim 13 further comprising:

a first groove in the upper portion of the sidewalls encircling the opening of the first member;

a second groove in the upper portion of the sidewalls encircling the first groove; and wherein the first sealing member is positioned in the first groove and the second sealing member is positioned in the second groove and the non-anodized portion is adjacent to to the anodized portion between an outer edge of the first groove and an inner edge of the second groove.

15. A plasma etching apparatus according to claim 14 wherein the first sealing member is a nonconductive O-ring and the second sealing member is a conductive O-ring positioned to electrically couple the sidewalls and the second electrode.

16. A plasma etching apparatus according to claim 15 wherein the conductive O-ring includes a conductive outer layer.

17. A plasma etching apparatus according to claim 15 wherein the anodized portion and the non-anodized portion of the inner surface are substantially co-planar adjacent to the upper surface of the sidewalls so that the peripheral portion of the inner surface is substantially planar adjacent to the upper surface of the sidewalls.

18. A plasma etching apparatus according to claim 17 wherein the first groove includes an outer edge furthest from the opening and wherein the anodized portion extends at least about 4 mm beyond the outer edge of the first groove.

* * * * *

UNITED STATES PATENT AND TRADEMARK OFFICE
CERTIFICATE OF CORRECTION

PATENT NO. : 6,074,519
DATED : June 13, 2000
INVENTOR(S) : Lee et al.

It is certified that error appears in the above-identified patent and that said Letters Patent is hereby corrected as shown below:

<u>Drawings,</u>
Sheet 2 of 8, the attached Figure 1B should be substituted for the Figure 1B that appears in sheet 2 of 8.

<u>Column 9,</u>
Line 39, should read -- encircling the opening of the first member; --
Line 43, should read -- groove and the second sealing member is positioned in --

Signed and Sealed this

Twenty-third Day of April, 2002

Attest:

JAMES E. ROGAN
Attesting Officer    Director of the United States Patent and Trademark Office